(12) United States Patent
Loccufier et al.

(10) Patent No.: US 9,839,961 B2
(45) Date of Patent: Dec. 12, 2017

(54) METALLIC NANOPARTICLE DISPERSION

(71) Applicant: AGFA GEVAERT, Mortsel (BE)

(72) Inventors: Johan Loccufier, Mortsel (BE); Nicolas Vriamont, Mortsel (BE); Dirk Bollen, Mortsel (BE)

(73) Assignee: AGFA GEVAERT, Mortsel (BE)

( * ) Notice: Subject to any disclaimer, the term of this patent is extended or adjusted under 35 U.S.C. 154(b) by 0 days.

(21) Appl. No.: 14/891,418

(22) PCT Filed: Jul. 2, 2014

(86) PCT No.: PCT/EP2014/064023
§ 371 (c)(1),
(2) Date: Nov. 16, 2015

(87) PCT Pub. No.: WO2015/000937
PCT Pub. Date: Jan. 8, 2015

(65) Prior Publication Data
US 2016/0082516 A1   Mar. 24, 2016

(30) Foreign Application Priority Data

Jul. 4, 2013 (EP) ..................................... 13175033

(51) Int. Cl.
| | |
|---|---|
| *C09D 11/52* | (2014.01) |
| *C09D 11/037* | (2014.01) |
| *C09D 5/24* | (2006.01) |
| *C09D 17/00* | (2006.01) |
| *B05D 3/02* | (2006.01) |
| *B22F 9/24* | (2006.01) |
| *H05K 1/09* | (2006.01) |
| *B22F 1/00* | (2006.01) |
| *C09D 5/00* | (2006.01) |
| *B05D 1/02* | (2006.01) |
| *C09D 1/00* | (2006.01) |
| *C09D 7/12* | (2006.01) |
| *B82Y 30/00* | (2011.01) |

(52) U.S. Cl.
CPC ............. *B22F 9/24* (2013.01); *B05D 1/02* (2013.01); *B05D 3/0254* (2013.01); *B22F 1/0022* (2013.01); *B22F 1/0044* (2013.01); *B22F 1/0059* (2013.01); *C09D 1/00* (2013.01); *C09D 5/00* (2013.01); *C09D 5/24* (2013.01); *C09D 7/12* (2013.01); *C09D 11/037* (2013.01); *C09D 11/52* (2013.01); *C09D 17/00* (2013.01); *H05K 1/097* (2013.01); *B22F 2301/255* (2013.01); *B22F 2304/05* (2013.01); *B82Y 30/00* (2013.01); *H05K 2203/122* (2013.01)

(58) Field of Classification Search
CPC ........ C09D 11/52; C09D 11/037; C09D 5/24; C09D 17/004; C09D 17/006; B22F 9/24; B22F 1/0022; B22F 1/0044; B22F 1/0059; B22F 2301/255; B05D 3/0254; B82Y 30/00

USPC ............. 106/31.92; 252/512, 513, 514, 515; 427/123, 126.3
See application file for complete search history.

(56) References Cited

U.S. PATENT DOCUMENTS

| | | | | |
|---|---|---|---|---|
| 9,240,258 | B2 * | 1/2016 | Andre | C09D 11/52 |
| 9,243,159 | B2 * | 1/2016 | Andre | C09D 11/52 |
| 9,275,773 | B2 * | 3/2016 | Andre | C09D 11/52 |
| 9,624,386 | B2 * | 4/2017 | Bollen | C09D 5/24 |
| 2004/0144959 | A1 * | 7/2004 | Conaghan | C09D 11/52 252/500 |
| 2010/0101637 | A1 | 4/2010 | Yamasaki et al. | |
| 2010/0261827 | A1 | 10/2010 | Peri et al. | |
| 2012/0168684 | A1 | 7/2012 | Magdassi et al. | |
| 2013/0153835 | A1 * | 6/2013 | Hinotsu | H01B 1/22 252/514 |
| 2015/0159029 | A1 * | 6/2015 | Andre | C09D 5/24 427/256 |
| 2016/0083594 | A1 * | 3/2016 | Bollen | C09D 5/24 427/125 |
| 2016/0108272 | A1 * | 4/2016 | Bollen | B22F 1/0022 427/123 |

FOREIGN PATENT DOCUMENTS

| | | |
|---|---|---|
| EP | 1 308 228 A1 | 5/2003 |
| EP | 2 147 733 A1 | 1/2010 |

(Continued)

OTHER PUBLICATIONS

Written Opinion of the International Search Authority dated Jan. 8, 2015 for PCT/EP2014/064023; 7 pages.*

(Continued)

*Primary Examiner* — Helene Klemanski
(74) *Attorney, Agent, or Firm* — Keating & Bennett, LLP

(57) ABSTRACT

A metallic nanoparticle dispersion includes metallic nanoparticles and a compound according to Formula I,

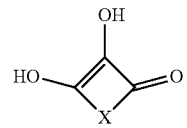

Formula I wherein X represents the necessary atoms to form a substituted or unsubstituted ring. The presence of small amounts of the compound according to Formula I increases the conductivity of metallic layers or patterns formed from the metallic nanoparticle dispersions at moderate curing conditions.

16 Claims, No Drawings

(56) References Cited

FOREIGN PATENT DOCUMENTS

| | | |
|---|---|---|
| EP | 2 468 827 A1 | 6/2012 |
| EP | 2 608 218 A1 | 6/2013 |
| EP | 2 671 927 A1 | 12/2013 |
| WO | 2010/036114 A2 | 4/2010 |
| WO | 2010/079884 A2 | 7/2010 |

OTHER PUBLICATIONS

Official Communication issued in International Patent Application No. PCT/EP2014/064023, dated Nov. 10, 2014.

* cited by examiner

METALLIC NANOPARTICLE DISPERSION

CROSS-REFERENCE TO RELATED APPLICATIONS

This application is a 371 National Stage Application of PCT/EP2014/064023, filed Jul. 2, 2014. This application claims the benefit of European Application No. 13175033.3, filed Jul. 4, 2013, which is incorporated by reference herein in its entirety.

BACKGROUND OF THE INVENTION

1. Field of the Invention

The present invention relates to metallic nanoparticle dispersions, to methods of preparing such metallic nanoparticle dispersions and to printing and coating fluids made from these dispersions with which highly conductive patterns or coatings can be formed at moderate curing conditions.

2. Description of the Related Art

The interest in printing or coating fluids containing metallic nanoparticles has increased during the last decades due to the unique properties of such metallic nanoparticles, when compared to the bulk properties of a given metal. For example, the melting point of metallic nanoparticles decreases with decreasing particle size, making them of interest for printed electronics, electrochemical, optical, magnetic and biological applications.

The production of stable and concentrated metallic printing or coating fluids, which can be printed for example by inkjet printing or screen printing, or coated at high speed, is of great interest as it enables the preparation of electronic devices at low costs.

Typically metallic nanoparticles are prepared by the polyol synthesis methodology as disclosed in Mat. Chem. Phys. 114, 549-555, by a derivative of the polyol synthesis methodology or by an in-situ reduction of metallic salts in the presence of various reducing agents. Such methods are disclosed in for example US2010143591, US2009142482, US20060264518 and US20080220155, EP2147733, EP2139007, EP803551, EP2012952, EP2030706, EP1683592, EP166617, EP2119747, EP2087490 and EP2010314, WO2008/151066, WO2006/076603, WO2009/152388 and WO2009/157393.

In such a polyol synthesis, so called capping agents are often used to stabilize the metallic precursor or metallic nanoparticles. Such capping agents usually contain functional groups such as thiol (—SH), carboxyl (—COOH), or amine (—NH) groups. U.S. Pat. No. 8,197,717 for example discloses a metallic ink comprising metallic nanoparticles made by the polyol synthesis wherein the nanoparticles are capped by a capping material such as polyvinylpyrrolidone (PVP).

After applying the metallic printing or coating fluids on a substrate, a sintering step, also referred to as curing step, at elevated temperatures is carried out to induce/enhance the conductivity of the applied patterns or layers. The organic components of the metallic printing or coating fluids, for example polymeric dispersants or capping agents, may reduce the sintering efficiency and thus the conductivity of the applied patterns of layers. For this reason, higher sintering temperatures and longer sintering times are often required to decompose the organic components.

Such high sintering temperatures are not compatible with common polymer foils, such as polyethylene terephthalate (PET) or polycarbonate, which have relatively low glass transition temperatures. There is thus an interest in lowering the sintering temperatures needed to obtain conductive layers or patterns.

EP-A 2468827 discloses polymeric dispersants, which have a 95 wt % decomposition at a temperature below 300° C. as measured by Thermal Gravimetric Analysis. By using metallic printing or coating fluids comprising such polymeric dispersants, the sintering temperature and time could be reduced. In EP-A 11194791.7 and EP-A 11194790.9 both filed on 21 Dec. 2011 a so called sintering additive is used in combination with a polymeric dispersant of EP-A 2468827 to further lower the sintering temperature. The amount of sintering additives, i.e. specific carboxylic acids or sulphonic acids, is more than 2 wt %, based on the total weight of the dispersion.

EP-A 12170774.9, filed on 5 Jun. 2012, discloses a metallic nanoparticle dispersion comprising a dispersion medium characterized in that the dispersion medium comprises a specific solvent, for example 2-pyrrolidone. When using such a solvent as dispersion medium, no polymeric dispersants are necessary to obtain stable metallic nanoparticle dispersions.

US2010/0084599 discloses the preparation of a silver nanoparticle composition containing a short-chain and a long-chain capping agent adsorbed on the silver particles. The capping agents are both anionic polyelectrolytes having a specific Molecular Weight.

U.S. Pat. No. 7,931,941 discloses a process for the synthesis of metallic nanoparticles by chemical reduction of metal salts in the presence of carboxylic acids including from 3 to 7 carbons capable of binding to the metal particles surfaces and stabilizing them against agglomeration. The synthesis is carried out in water.

US2010/0090179 discloses a process for producing carboxylic acid-stabilized silver nanoparticles wherein silver salt particles are reduced in a solution containing the carboxylic acids.

SUMMARY OF THE INVENTION

Preferred embodiments of the present invention provide a metallic nanoparticle dispersion with which high conductive metallic layers or patterns can be prepared at moderate curing conditions.

The advantages and benefits realised by the metallic nanoparticle dispersion are as defined below. It has been found that the presence in the metallic nanoparticle dispersion of a small amount of a specific compound increases the conductivity of layers or patterns prepared with the dispersion.

Other preferred embodiments of the present invention provide a method of preparing such metallic nanoparticle dispersions.

Further advantages and embodiments of the present invention will become apparent from the following description.

DETAILED DESCRIPTION OF THE PREFERRED EMBODIMENTS

Metallic Nanoparticle Dispersion

The metallic nanoparticle dispersion according to a preferred embodiment of the present invention comprises metallic nanoparticles and a compound according to Formula I,

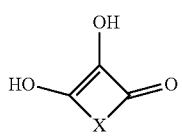

Formula I wherein

X represents the necessary atoms to form a substituted or unsubstituted ring.

The metallic nanoparticles comprise one or more metals in elemental or alloy form. The metal is preferably selected from the group consisting of silver, gold, copper, nickel, cobalt, molybdenum, palladium, platinum, tin, zinc, titanium, chromium, tantalum, tungsten, iron, rhodium, iridium, ruthenium, osmium, aluminium and lead. Metallic nanoparticles based on silver, copper, molybdenum, aluminium, gold, copper, or a combination thereof, are particularly preferred. Most preferred are silver nanoparticles.

The term "nanoparticles" refers to dispersed particles having an average particle size below 200 nm at the end of the dispersion preparation. The metallic nanoparticles have an average particle size at the end of the dispersion preparation of less than 200 nm, preferably less than 100 nm, more preferably less than 50 nm, most preferably less than 30 nm.

The metallic nanoparticle dispersion comprises preferably less than 500 µmol/g metal, more preferably less than 250 µmol/g metal, most preferably less than 150 µmol/g metal of a compound according to Formula I:

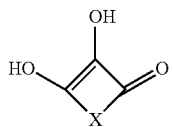

Formula I wherein X represents the necessary atoms to form a substituted or unsubstituted ring.

X preferably represents the necessary atoms to form a substituted or unsubstituted five membered ring.

The concentration of the compound according to Formula I is preferably at least 10 µmol/g metal, more preferably at least 25 µmol/g metal.

In a preferred embodiment the metallic nanoparticle dispersion comprises a compound according to Formula II:

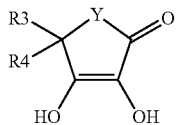

Formula II wherein:

Y is selected from the group consisting of $CR_5R_6$ and O, and $R_3$ to $R_6$ are independently selected from a hydrogen, a substituted or unsubstituted alkyl group, a substituted or unsubstituted alkenyl group, a substituted or unsubstituted alkynyl group, a substituted or unsubstituted alkaryl group, a substituted or unsubstituted aralkyl group and a substituted or unsubstituted aryl or heteroaryl group.

In preferred compounds according to Formula II, $R_3$ to $R_6$ are independently selected from a hydrogen and a substituted or unsubstituted alkyl group.

In particularly preferred embodiment, the compound according to Formula II is an ascorbic or erythorbic acid derivative.

In the most preferred embodiment, the compound according to general Formula II is selected from the group consisting of ascorbic acid and erythorbic acid.

Typical examples of compounds according to Formula II are given in table 1, without being limited thereto.

TABLE 1

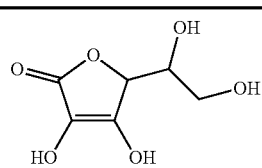

Red-1

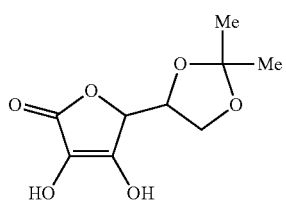 [SMILES: CC1(C)OCC(C2OC(=O)C(O)=C2O)O1]

Red-2

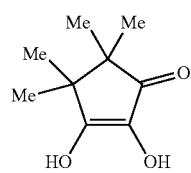

Red-3

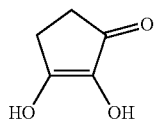

Red-4

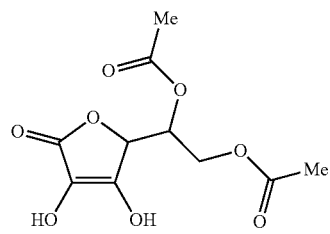 [SMILES: CC(=O)OCC(OC(C)=O)C1OC(=O)C(O)=C1O]

Red-5

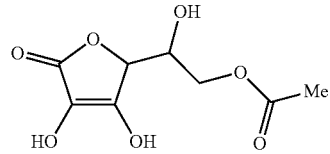 [SMILES: CC(=O)OCC(O)C1OC(=O)C(O)=C1O]

Red-6

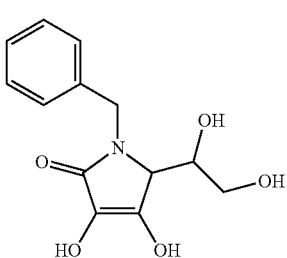 [SMILES: O=C1C(O)=C(O)C(C(O)CO)N1Cc1ccccc1]

Red-7

TABLE 1-continued

| | |
|---|---|
| 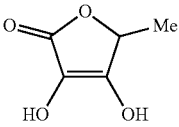 | Red-8 |
| 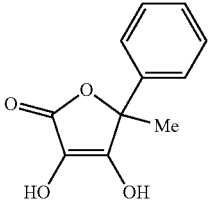 [SMILES: CC1(c2ccccc2)OC(=O)C(O)=C1O] | Red-9 |
| 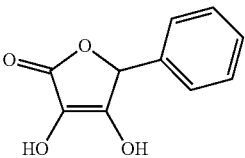 [SMILES: O=C1OC(c2ccccc2)C(O)=C1O] | Red-10 |
| 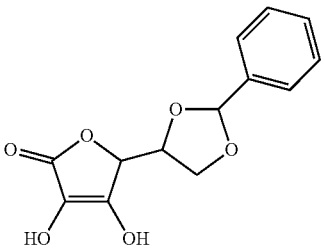 [SMILES: O=C1OC(C2COC(c3ccccc3)O2)C(O)=C1O] | Red-11 |
| 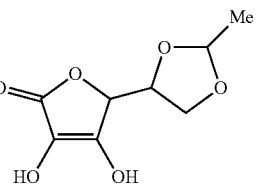 | Red-12 |

The compound according to Formula I may be added to the metallic nanoparticle dispersion at any time during its preparation. However, it may be advantageous for stability reasons to add the acid at the end of the preparation process. Also for stability reasons, it may be advantageous to add the acid to the metallic nanoparticle dispersion just before using it, for example just before coating or printing.

Dispersion Medium

The dispersion medium preferably comprises a solvent according to Formula III,

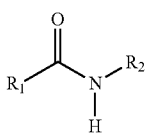

Formula III wherein
R$_1$ and R$_2$ represent an optionally substituted alkyl group, and
R$_1$ and R$_2$ may form a ring,
The term "alkyl" in Formula III means all variants possible for each number of carbon atoms in the alkyl group i.e. for three carbon atoms: n-propyl and isopropyl; for four carbon atoms: n-butyl, isobutyl and tertiary-butyl; for five carbon atoms: n-pentyl, 1,1-dimethyl-propyl, 2,2-dimethyl-propyl and 2-methyl-butyl etc.

In a preferred embodiment the dispersion medium comprises a solvent according to Formula IV,

Formula IV wherein
L is an optionally substituted linear or branched C$_2$-C$_{11}$ alkylene group.

In a more preferred embodiment the dispersion medium comprises a solvent selected from an optionally substituted 2-pyrrolidone, β-lactam, γ-lactam, δ-lactam, or ε-lactam.

In an even more preferred embodiment the metallic nanoparticle dispersion comprises as dispersion medium a solvent selected from 2-pyrrolidone, 4-hydroxy-2-pyrrolidone, δ-valerolactam or ε-caprolactam. In a most preferred embodiment the dispersion medium comprises 2-pyrrolidone.

The metallic nanoparticle dispersion comprises the solvent as defined above in an amount between 1 and 75 wt %, preferably between 2.5 and 50 wt %, more preferably between 5 and 25 wt % relative to the total weight of the dispersion.

The dispersion medium of the metallic nanoparticle dispersion may comprise, in addition to the solvent according to Formula III, a co-solvent, preferably an alcohol or a ketone. The co-solvent is more preferably ethanol or methylethyl ketone (MEK). The co-solvent may be present from the start of the preparation of the metallic nanoparticle dispersion or may be added during or at the end of the preparation.

Polymeric Dispersant

The dispersion medium may contain a dispersant, typically a polymeric dispersant. However, as such polymeric dispersants (or other additives) may lower the conductivity of the coatings prepared with the metallic nanoparticle dispersion at low sintering temperatures, it is preferred not to use them.

Polymeric dispersants are typically homo- or copolymers prepared from acrylic acid, methacrylic acid, vinyl pyrrolidinone, vinyl butyral, vinyl acetate or vinyl alcohol monomers.

The polymeric dispersants disclosed in EP-A 2468827 having a 95 wt % decomposition at a temperature below 300° C. as measured by Thermal Gravimetric Analysis may also be used.

However, in a preferred embodiment the metallic nanoparticle dispersion according to the present invention comprises less than 5 wt % of a polymeric dispersant relative to the total weight of the dispersion, more preferably less than 1 wt %, most preferably less than 0.1 wt %. In a particularly preferred embodiment the dispersion comprises no polymeric dispersant at all.

Printing or Coating Fluid

A metallic printing or coating fluid, also referred to respectively as a metallic ink or a metallic coating solution, may be prepared from the metallic nanoparticle dispersion.

The metallic nanoparticles dispersion may be directly used as a metallic printing or coating fluid. However, to optimize the coating or printing properties, and also depending on the application for which it is used, additives such as reducing agents, wetting/levelling agents, dewettting agents, rheology modifiers, adhesion agents, tackifiers, humectants, jetting agents, curing agents, biocides or antioxidants may be added to the metallic nanoparticle dispersion.

Preferably, the compound according to Formula I may be added while preparing the metallic printing or coating fluid.

The total amount of additives is preferably less than 20 wt %, more preferably less than 10 wt %, and even more preferably less than 5 wt %, relative to the total weight of the metallic printing or coating fluid.

A thickening agent may be added to increase the viscosity of the printing or coating fluid. Preferred thickening agents may be selected from amorphous silica, polyvinylpyrrolidones having different Molecular Weights, and cellulose based thickening agents. A particular preferred thickening agent is hydroxypropylcellulose.

High boiling solvents are preferably added to the ink to prevent drying of the ink during printing. Moreover, such high boiling solvents also have a positive influence on the conductivity of the ink. Preferred high boiling solvents are diethyleneglycol (DEG), 2-butoxyethanol and 1-methoxy-2-propanol.

Also diluents may be added to the metallic dispersions when preparing the metallic printing or coating fluids. The amount of these optional diluents is preferably less than 75 wt %, more preferably less than 60 wt % relative to the total weight of the ink. The diluents may be selected from alcohols, aromatic hydrocarbons, ketones, esters, aliphatic hydrocarbons, higher fatty acids, carbitols, cellosolves, and higher fatty acid esters. Suitable alcohols include methanol, ethanol, propanol, 1-butanol, 1-pentanol, 2-butanol, t-butanol. Suitable aromatic hydrocarbons include toluene, and xylene. Suitable ketones include methyl ethyl ketone, methyl isobutyl ketone, 2,4-pentanedione and hexa-fluoroacetone. Also glycol, glycolethers, N,N-dimethyl-acetamide, N,N-dimethylformamide may be used.

The preparation of the metallic printing or coating fluids comprises the addition of the optional additives and/or diluents to the metallic nanoparticle dispersion by using a homogenization technique such as stirring, high shear mixing, ultra-sonication, or a combination thereof. The homogenization step can be carried out at elevated temperature up to 100° C. In a preferred embodiment, the homogenization step is carried out at temperature equal or below 60° C.

In a preferred embodiment, a metallic screen printing ink is prepared. Such a screen printing ink has a viscosity between 3000 and 400000 mPa·s, preferably between 5000 and 100000 mPa·s, more preferably between 10000 and 50000 mPa·s. According to a particularly preferred embodiment, a silver screen printing ink is prepared.

In another preferred embodiment, a metallic flexographic or gravure ink is prepared. Such an ink has a viscosity between 50 and 3000 mPa·s, preferably between 200 and 1000 mPa·s, most preferably between 300 and 500 mPas·s. According to a particularly preferred embodiment, a silver flexographic ink is prepared.

In another preferred embodiment, a metallic inkjet ink is prepared. Such an inkjet ink has a viscosity between 1 and 50 mPa·s, preferably between 5 and 30 mPa·s, more preferably between 7 and 15 mPa·s. According to a particularly preferred embodiment, a silver inkjet ink is prepared.

The viscosities referred to above are measured at a shear rate of 1/s at temperature between 20 and 25° C. (for example with an AR2000 Rheometer from Texas Instruments).

Metallic Layers or Patterns

The metallic layers or patterns printed or coated from the metallic printing or coating fluids can be rendered more conductive at lower sintering temperatures compared to those obtained with conventional metallic printing or coating fluids.

The metallic layers or patters are prepared by a method comprising the steps of applying a printing or coating fluid as defined above on a substrate followed by a drying and/or sintering step, possibly combined in one step.

Multiple metallic layers or patterns, i.e. a stack of patterned or unpatterned layers, may be applied on a substrate. The substrate referred to in the method of preparing the metallic layers or patterns thus also encompass a previously applied metallic layer or pattern.

The metallic layers or patterns may also be realized by inkjet printing or by any conventional printing techniques such as flexography, offset, gravure or screen printing or by any conventional coating technique such as spray coating, blade coating, slot die coating.

After the layers or patterns are applied on the substrate, a sintering step, also referred to as curing step, is carried out. During this sintering step, solvents evaporate and the metallic particles sinter together. Once a continuous percolating network is formed between the metallic particles, the layers or patterns become conductive. Conventional curing is carried out by applying heat. The curing temperature and time are dependent on the substrate used and on the composition of the metallic layer or pattern. The curing step for curing the metallic layers may be performed at a temperature below 250° C., preferably below 200° C., more preferably below 180° C., most preferably below 160° C.

The curing time is preferably ≤60 minutes, more preferably ≤30 minutes and most preferably ≤15 minutes, depending on the selected temperature, substrate and composition of the metallic layers.

However, instead of or in addition to the conventional curing by applying heat, alternative curing methods such as exposure to an Argon laser, to microwave radiation, to UV radiation or to low pressure Argon plasma, photonic curing, plasma or plasma enhanced, electron beam or pulse electric current sintering may be used.

The metallic layers of the present invention allow low enough curing temperatures making it is possible to use polymeric substrates that can not withstand thermal treatment at high temperature, such as for example PET. The low curing times enables a high productivity.

The conductivity of the metallic layers or patters, after curing and expressed as % of the bulk conductivity (of the metal) is preferably ≥10, more preferably ≥20%, most preferably ≥30%.

The metallic layers or patterns may be used in various electronic devices or parts of such electronic devices as for example organic photo-voltaics (OPV's), inorganic photo-voltaics (c-Si, a-Si, CdTe, CIGS), OLED displays, OLED lighting, inorganic lighting, RFID's, organic transistors, thin film batteries, touch-screens, e-paper, LCD's, plasma, sensors, membrane switches or electromagnetic shielding.

Method to Prepare the Metallic Nanoparticle Dispersion

The metallic nanoparticle dispersion can be prepared by any known method to prepare such dispersions as long that the compound according to Formula I is added during the preparation method so that the concentration of compound in the final metallic nanoparticle dispersion is preferably less than 500 µmol/g metal, more preferably less than 250 µmol/g metal, most preferably less than 150 µmol/g metal.

The concentration of the compound according to Formula I is preferably at least 10 μmol/g metal, more preferably at least 25 μmol/g metal.

It has been observed that the acid may be added at the start of the preparation method, in the course of the preparation method or at the end of the preparation method. For stability purposes, it may be advantageous to add the acid or the precursor at the end of the preparation method.

First Embodiment to Prepare the Metallic Nanoparticle Dispersion

A preferred method to prepare a metallic nanoparticle dispersion comprises the steps of:

dispersing metal precursor particles in a dispersion medium comprising a solvent according to Formula III; and

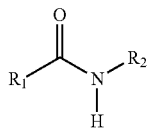

Formula III wherein $R_1$ and $R_2$ represent an optionally substituted alkyl group, and $R_1$ and $R_2$ may form a ring, reducing the metal precursor with a reducing agent to form metallic nanoparticles;

wherein a compound according to Formula I,

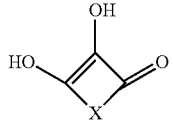

Formula I wherein

X represents the necessary atoms to form a substituted or unsubstituted five membered ring, is added during or at the end of the preparation method.

The metal precursor dispersion is prepared by adding the metal precursor to the dispersion medium, containing the solvent according to Formula III.

The metal precursor particles are typically available as powders, flakes, particles or aggregated particles. Prior to the dispersion preparation the flakes or powders may be down-sized by mean of dry milling, wet-milling, high shear dispersion methods or sieving techniques.

To prepare the metal precursor dispersion typical dispersion methods such as precipitation, mixing, milling, in-situ synthesis or a combination thereof may used. The experimental conditions such as temperature, process time, energy input, etc. depend on the methodology chosen. The dispersion process can be carried out in a continuous, batch or semi-batch mode.

Mixing apparatuses may include a pressure kneader, an open kneader, a planetary mixer, a dissolver, a high shear stand mixer, and a Dalton Universal Mixer. Suitable milling and dispersion apparatuses are a ball mill, a pearl mill, a colloid mill, a high-speed disperser, double rollers, a bead mill, a paint conditioner, and triple rollers. Many different types of materials may be used as milling media, such as glasses, ceramics, metals, and plastics. The dispersions may also be prepared using ultrasonic energy.

The concentration of the metal precursor dispersion, expressed in wt % metal, is preferably between 1 and 50 wt %, more preferably between 2 and 25 wt %, most preferably between 3 and 15 wt %.

The metallic nanoparticles are prepared from metal precursor particles by means of a reduction step, for example the reduction of metal oxides to metals.

Metal precursor particles may be selected from the group consisting of metal oxides, metal salts, metal hydroxides, and metal complexes.

Preferred metal oxide particles are silver oxide, tin oxide, titanium oxide, zirconium oxide, wolfram oxide, molybdenum oxide, cadmium oxide, copper oxide or zinc oxide particles.

Also doped metal oxide particles such as ZnO:Al, $SnO_2$:F or $SnO_2$:Sb particles may be used.

Preferred metal hydroxide particles are copper hydroxide, titanium hydroxide, zirconium hydroxide, wolfram hydroxide, molybdenum hydroxide, cadmium hydroxide or zinc hydroxide particles.

Preferred metal salts include inorganic acid salts, such as nitrates, carbonates, chlorides, phosphates, borates, sulfonates and sulfates, and organic acid salts, such as stearate, myristate or acetate.

As mentioned above, particularly preferred metallic nanoparticles are silver nanoparticles. These may be prepared, for example, by the reduction of silver oxide, silver nitrate or silver acetate.

The reducing agents used in this reduction step are preferably soluble in the dispersion medium. The reducing agents may be selected from the group consisting of hydroxylamine and derivatives thereof, formic acid, oxalic acid, ascorbic acid, hydrazine and derivatives thereof, dithiothreitol, phosphites, hydrophosphites, phosphorous acid and derivatives thereof, lithium aluminum hydride, diisobutylaluminum hydride, sodium borohydride, sulfites, tin(II) complexes, iron(II) complexes, zinc mercury amalgam, sodium amalgam, atomic hydrogen, or Lindlar catalyst.

Preferred reducing agents are hydroxylamine of derivatives thereof, N,N-diethylhydroxylamine being particularly preferred. Another preferred reducing agent is formic acid.

The amount of reducing agent used, expressed as molar ratio of the reducing agent to metal is preferably between 0.6 and 10, more preferably between 0.8 and 8, most preferably between 1 and 6.

The degree of reduction of the metal precursor to metallic nanoparticles is preferably between 60 and 100%.

The reducing agent is preferably added to the dispersion in a controlled way, so as to prevent a too fast reduction of the precursor.

Second Embodiment to Prepare the Metallic Nanoparticle Dispersion

Another preferred method to prepare a metallic nanoparticle dispersion according to the present invention comprises the steps of:

forming a metal precursor dispersion or solution by adding a metallic precursor to a dispersion medium comprising;

(a) a solvent according to Formula III, and

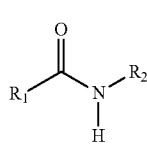

Formula III wherein
R₁ and R₂ represent an optionally substituted alkyl group,
R₁ and R₂ may form a ring,
(b) a carboxylic acid according to Formula V, R—COOH  Formula V wherein
R is an optionally substituted C2-C7 alkyl, alkenyl, alkynyl or cycloalkyl group,
reducing the metallic precursor with a reducing agent to form metallic nanoparticles;
sedimenting the metallic nanoparticles to obtain a concentrated metallic nanoparticle dispersion comprising at least 15 wt % of metallic nanoparticles;
wherein a compound according to Formula I,

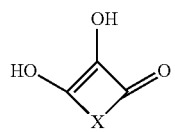

Formula I wherein
X represents the necessary atoms to form a substituted or unsubstituted five membered ring,
is added during or at the end of the preparation method.

It has been observed that by using the combination of the solvent according to Formula III and the carboxylic acid according to Formula V, a fine and homogenous sediment of metal nanoparticles can be obtained, which is easily redispersed and with which highly conductive layers may be prepared. A possible explanation may be that both the solvent according to Formula III and the carboxylic acid according to Formula V stabilize the metal precursor particles and/or the metal nanoparticle which may result in the absence of agglomerates of particles. There are indications that the solvent according to Formula III especially stabilizes the metal nanoparticles, while the carboxylic acid stabilizes the metal precursor particles.

The reaction or dispersion medium used in the preferred method to prepare the metallic nanoparticle dispersion contains a carboxylic acid according to Formula V, R—COOH  Formula V wherein
R is an optionally substituted $C_2$-$C_7$ alkyl, alkenyl, alkynyl or cycloalkyl group.

A $C_2$-$C_7$ alkyl, alkenyl, alkynyl or cycloalkyl group contains between 2 and 7 carbon atoms.

R is preferably an optionally substituted $C_2$-$C_7$ alkyl group. The term "alkyl" means all variants possible for each number of carbon atoms in the alkyl group i.e. for three carbon atoms: n-propyl and isopropyl; for four carbon atoms: n-butyl, isobutyl and tertiary-butyl; for five carbon atoms: n-pentyl, 1,1-dimethyl-propyl, 2,2-dimethylpropyl and 2-methyl-butyl etc.

Preferably R is a n-alkyl group. When the chain length of the alkyl group increases an increase of the viscosity of the reaction mixture has been observed. On the other hand, the acids with a shorter alkyl group have an unacceptable smell. The R group in Formula V is most preferably a $C_4$-$C_6$ n-alkyl group.

Particularly preferred carboxylic acids according to Formula V are pentanoic acid, hexanoic acid and heptanoic acid.

The amount of carboxylic acid according to Formula V used in a method of the present invention, expressed as molar ratio of carboxylic acid to metal is preferably between 1 and 10, more preferably between 2 and 8, most preferably between 3 and 6.

The metal precursor dispersion is prepared by adding the metal precursor to the dispersion medium as described for the dispersion method disclosed above. The dispersion medium however now contains the solvent according to Formula I and the carboxylic acid according to Formula V.

The metallic nanoparticles are prepared from metal precursor particles by a reduction step, for example the reduction of metal oxides to metals. The reduction may be carried out as disclosed above.

To realize a highly concentrated metallic nanoparticle dispersion comprising at least 15 wt % of metallic nanoparticles, a sedimentation step is carried out after the reduction step.

After the sedimentation step, a fine, homogeneous sediment of metallic nanoparticles is obtained. The sedimentation step, and the optional washing steps, also results in the removal of organic ingredients (solvent, carboxylic acid, reducing agent, binder) that may have a negative influence on the conductivity of coatings from the dispersions.

Preferably, after the reduction step the dispersion is transferred to a sedimentation vessel containing a stirrer and a tube to remove the supernatant. However, other methods to separate the sediment from the supernatant may also be used.

Sedimentation is preferably carried out by allowing the mixture to stand without stirring for some time, for example overnight.

Sedimentation may however be induced or accelerated by solvent evaporation, by adding a non-solvent, by centrifugation or by ultracentrifugation.

When sedimentation is complete, the supernatant is removed from the sediment. It is very important no to disturb the sediment during the separation of the supernatant from the sediment.

Preferably, one or more washing steps are carried out on the sediment obtained, to further remove, at least partially, unwanted ingredients still present in the sediment.

In a washing step, a solvent is added to the sediment and the resulting dispersion is stirred for some time, for example one hour or half an hour.

Then, the mixture is allowed to stand without stirring for some time, for example one hour, resulting in a sediment and a supernatant. The supernatant is then removed.

Several washing steps may be carried out, using the same or different solvents.

The solvents are chosen taking into account the removal of unwanted ingredients from the sediment and the sedimentation of the metal nanoparticles in that solvent. Reversible agglomeration of the metal nanoparticles may accelerate the sedimentation. It has been observed that metal nanoparticles prepared by the method of the present invention, i.e. in the presence of the solvent of Formula III and the carboxylic acid according to Formula V, are indeed characterized by such a reversible aggregation, thus accelerating the sedimentation but forming easily redispersible sediment.

The solvent used in the last washing step is chosen, also taking the conductivity and the print properties of the printing or coating fluid made from the dispersion into account.

In a preferred embodiment, four washing steps are carried out. The first two washing steps with 1-methoxy-2-propanol, the last two with Butylcellosolve™, a butylglycolether from DOW CHEMICALS.

The highly concentrated metallic nanoparticle dispersion obtained by a method of the present invention contains at least 15 wt %, more preferably at least 30 wt %, most preferably at least 50 wt % of metallic nanoparticles, relative to the total weight of the dispersion. Particularly preferred, the metallic nanoparticle dispersion contains between 60 and 80 wt % of metallic nanoparticles relative to the total weight of the dispersion.

When the metallic nanoparticle dispersion is prepared with this preparation method it is preferred to add the acid of the acid precursor to the metallic nanoparticle dispersion after the washing steps or while preparing the coating or printing fluids from the highly concentrated metallic nanoparticle dispersion.

EXAMPLES

Materials

All materials used in the following examples were readily available from standard sources such as ALDRICH CHEMICAL Co. (Belgium) and ACROS (Belgium) unless otherwise specified. All materials were used without further purification unless otherwise specified.

Butylcellosolve™ is a butylglycolether from DOW CHEMICALS.
Dowanol PM™ is 1-methoxy-2-propanol from DOW CHEMICALS.
Klucel™ J, is hydroxypropylcellulose from HERCULES.
DAPRO DF 6800, a defoaming agent (polysiloxane containing hydrophobically modified silica) from ELEMENTIS.
Disperbyk®-2025, a wetting additive from BYK Additives & Instruments.
IPA is isopropyl alcohol.
EtOAc is ethylacetate.
AcOH is acetic acid.
THF is tetrahydrofuran.
MEK is methylethylketon.
DMA is N,N-dimethylacetamide.
NMP is N-methyl pyrrolidone.
Silver oxide from UMICORE.

Example 1

Preparation of the Silver Nanoparticle Dispersion NPD-01 to NPD-03

78.0 g of silver oxide was slowly added, while stirring, to a 1 l reactor containing 275.0 g of pentanoic acid and 401.0 g of 2-pyrrolidone. The temperature of the mixture was kept at 25° C.

After complete addition of the silver oxide, the suspension was stirred overnight at 25° C.

Then, 300.0 g of N,N-diethylhydroxylamine was added in a time span of 1.5 hours to the suspension. The temperature of the reaction mixture was kept at 25° C. When all reducing agent was added, the reaction mixture was kept at 25° C. while stirring for another hour.

The reaction mixture is then fed to a sedimentation vessel, where it was kept overnight, without stirring. The supernatant was carefully removed from the sediment.

The obtained sediment was washed four times, two times with Dowanol PM™ (547 g) and two times with Butylcellosolve™ (547 g). In each washing step, the solvent was added to the sediment and the resulting suspension stirred for 0.5 hour at 300 rpm. Then, the unstirred suspension was kept for another hour, and the supernatant carefully removed.

After the last washing step with Butylcellosolve™, the sediment was centrifuged, in a centrifugal decanter from Rousselet Robatel (France) at 3000 rpm during 0.5 hour.

To the silver nanoparticle dispersion thus obtained, ascorbic acid was added in amounts as shown in Table 2.

The silver nanoparticle dispersions were then coated on a polyester support (blade coater, coating thickness was 10 µm).

The coated layers were dried and cured at 150° C. for 30 minutes.

The surface resistance (SER) was measured using a four-point collinear probe. The surface or sheet resistance was calculated by the following formula:

$$SER = (\pi/\ln 2)^*(V/I)$$

wherein
SER is the surface resistance of the layer expressed in Ω/;
π is a mathematical constant, approximately equal to 3.14;
ln 2 is a mathematical constant equal to the natural logarithmic of value 2, approximately equal to 0.693;
V is voltage measured by voltmeter of the four-point probe measurement device;
I is the source current measured by the four-point probe measurement device.

For each sample, three measurements were performed at different positions of the coating and the average value was calculated.

The silver content $M_{Ag}$ (g/m$^2$) of the coatings was determined by WD-XRF.

The conductivity of the coated layers was determined by calculating the conductivity as a percentage of the bulk conductivity of silver using the following formula:

$$\% \text{ Ag}_{(bulk)} = \frac{\rho_{Ag} * \sigma_{Ag}}{M_{Ag} * SER} * 10^{-5} * 100\% = \frac{0.1663}{M_{Ag} * SER} * 100\%$$

wherein
$\rho_{Ag}$ is the density of silver (10.49 g·cm$^{-3}$) and $\sigma_{Ag}$ the specific conductivity of silver (equal to 6.3 10$^5$ S/cm).

The conductivities are shown in Table 2.

TABLE 2

|  | µmol ascorbic acid/g Ag | % Ag bulk |
|---|---|---|
| NPD-01 (COMP) | — | 0 |
| NPD-02 (INV) | 36 | 7.1 |
| NPD-03 (INV) | 52 | 59.4 |
| NPD-04 (INV) | 91 | 27.5 |

It is clear from Table 2 that the addition of small amounts of ascorbic acid results in a substantial increase of the conductivity of the layers obtained from the silver dispersions.

Example 2

Preparation of the silver nanoparticle dispersion NPD-05 to NPD-06

25.0 g of silver oxide (from Umicore) was added while stirring to a mixture of 45.0 g of ethanol and 44.8 g of 2-pyrrolidone to obtain a pre-dispersion. The pre-dispersion was then stirred for 24 hours.

Then, 1.73 ml of formic acid was added (1.25 ml/min) to the pre-dispersion while stirring and keeping the temperature at room temperature. After 90 min, a second 1.73 ml of formic acid was added (1.25 ml/min) to the mixture while stirring and keeping the temperature at room temperature. After the addition of the formic acid, the mixture was further stirred for 2.5 hours at 23-25° C.

Then, the mixture was filtered using a 60 μm filter cloth. The filtrate was then concentrated at 40° C., first for 60 min at 110 mbar, then for 30 min at 60 mbar.

To the silver nanoparticle dispersion thus obtained, ascorbic acid was added in amounts as shown in Table 3.

The silver nanoparticle dispersions were then coated on a polyester support (blade coater, coating thickness was 10 μm).

The coated layers were dried and cured at 150° C. for 30 minutes.

Conductivity measurements were carried out as in Example 1. The results are shown in Table 3.

TABLE 3

| | μmol ascorbic acid/g Ag | % Ag bulk |
|---|---|---|
| NPD-05 (COMP) | — | 0.5 |
| NPD-06 (INV) | 142 | 22.3 |

It is clear from Table 3 that the addition of ascorbic acid to the silver nanoparticle dispersion substantially increases the conductivity of a layer obtained form the silver dispersion.

The invention claimed is:

1. A metallic nanoparticle dispersion comprising:
   metallic nanoparticles; and
   a compound according to Formula I:

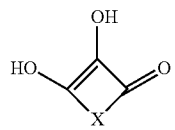

Formula I wherein
   X represents necessary atoms to form a substituted or unsubstituted ring; and
   the metallic nanoparticle dispersion includes less than 500 μmol/g metal of the compound according to Formula I.

2. The metallic nanoparticle dispersion according to claim 1, wherein the metallic nanoparticle dispersion includes less than 500 μmol/g metal of a compound according to Formula II:

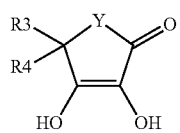

Formula II wherein
   Y is selected from the group consisting of $CR_5R_6$ and O; and
   $R_3$ to $R_6$ are independently selected from a hydrogen, a substituted or unsubstituted alkyl group, a substituted or unsubstituted alkenyl group, a substituted or unsubstituted alkynyl group, a substituted or unsubstituted alkaryl group, a substituted or unsubstituted aralkyl group, and a substituted or unsubstituted aryl or heteroaryl group.

3. The metallic nanoparticle dispersion according to claim 2, wherein the compound according to Formula II is an ascorbic or erythorbic acid derivative compound.

4. The metallic nanoparticle dispersion according to claim 1, further comprising a solvent according to Formula III:

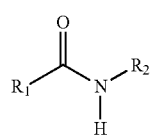

Formula III wherein
   $R_1$ and $R_2$ represent an optionally substituted alkyl group; and
   $R_1$ and $R_2$ optionally form a ring.

5. The metallic nanoparticle dispersion according to claim 1, further comprising an acid according to Formula V:

R—COOH         Formula V wherein
   R is a $C_2$-$C_7$ alkyl, alkenyl, alkynyl, or cycloalkyl group.

6. The nanoparticle dispersion according to claim 1, wherein the metallic nanoparticles include silver nanoparticles.

7. A coating or printing fluid comprising:
   a metallic nanoparticle dispersion as defined in claim 1; and
   one or more additives selected from a thickening agent, a high boiling solvent, and a wetting agent.

8. The coating or printing fluid according to claim 7, wherein the thickening agent is a cellulose derivative.

9. The coating or printing fluid according to claim 7, wherein the high boiling solvent is selected from diethyleneglycol, 1-methoxy-2-propanol, and 2-butoxyethanol.

10. A method of preparing a metallic nanoparticle dispersion, the method comprising the steps of:
    dispersing metal precursor particles in a dispersion medium including a solvent according to Formula III:

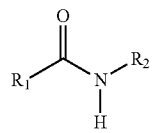

Formula III wherein
   $R_1$ and $R_2$ represent an optionally substituted alkyl group; and
   $R_1$ and $R_2$ optionally form a ring;
   reducing the metal precursor particles with a reducing agent to form metallic nanoparticles; and
   adding a compound according to Formula I during or at an end of the method such that the metallic nanoparticle dispersion includes less than 500 μmol/g metal of the compound according to Formula I:

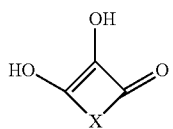

Formula I wherein

X represents atoms necessary to form a substituted or unsubstituted five membered ring.

11. The method according to claim 10, further comprising:
an evaporation step, a sedimentation step, or an ultrafiltration step to evaporate at least a portion of the dispersion medium.

12. A method of preparing a metallic nanoparticle dispersion, the method comprising the steps of:
forming a metal precursor dispersion or solution by adding a metallic precursor to a dispersion medium comprising:
(a) a solvent according to Formula III:

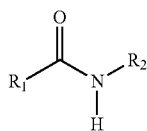

Formula III wherein
$R_1$ and $R_2$ represent an optionally substituted alkyl group; and
$R_1$ and $R_2$ optionally form a ring;
(b) a carboxylic acid according to Formula V:

R—COOH    Formula V wherein
R is an optionally substituted C2-C7 alkyl, alkenyl, alkynyl, or cycloalkyl group;

reducing the metallic precursor with a reducing agent to form metallic nanoparticles;
sedimenting the metallic nanoparticles to obtain a concentrated metallic nanoparticle dispersion including at least 15 wt % of metallic nanoparticles; and
adding a compound according to Formula I during or at an end of the method such that the metallic nanoparticle dispersion includes less than 500 µmol/g metal of the compound according to Formula I:

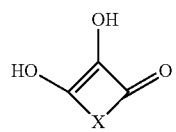

Formula I wherein
X represents atoms necessary to form a substituted or unsubstituted five membered ring.

13. A method of preparing a conductive metallic layer or pattern, the method comprising the steps of:
applying the metallic nanoparticle dispersion as defined in claim 1 on a substrate; and
curing the metallic nanoparticle dispersion.

14. A method of preparing a conductive metallic layer or pattern, the method comprising the steps of:
applying the printing or coating fluid as defined in claim 7 on a substrate; and
curing the coating or printing fluid applied on the substrate.

15. The method of preparing a conductive metallic layer or pattern according to claim 13, wherein the step of curing is performed at a temperature of 160° C. or less and within 30 minutes or less.

16. The method of preparing a conductive metallic layer or pattern according to claim 14, wherein the step of curing is performed at a temperature of 160° C. or less and within 30 minutes or less.

* * * * *